United States Patent [19]

Theriault

[11] 4,263,619
[45] Apr. 21, 1981

[54] DOUBLE TRAPPING OF ADJACENT CHANNEL SOUND

[75] Inventor: Gerald E. Theriault, Hopewell, N.J.

[73] Assignee: RCA Corporation, New York, N.Y.

[21] Appl. No.: 32,025

[22] Filed: Apr. 20, 1979

[51] Int. Cl.³ .............................................. H04N 5/60
[52] U.S. Cl. .................................... 358/196; 333/176
[58] Field of Search ............... 358/196; 333/176, 168, 333/164; 328/167, 165

[56] References Cited

U.S. PATENT DOCUMENTS

| | | | |
|---|---|---|---|
| 2,312,145 | 2/1943 | Bradley | 358/196 |
| 3,074,026 | 1/1963 | Kuzminsky | 333/176 |
| 3,204,025 | 8/1965 | Przybyszewski | 358/196 |
| 3,217,096 | 11/1965 | Caprio | 358/196 |
| 3,562,417 | 2/1971 | Poppa | 358/196 |

OTHER PUBLICATIONS

RCA Victor Service Data, 1954, No. T13, Model 21-C-T-55, 11/24/54.
RCA Television Service Data File 1978 C-2 For CTC-87 Series Chassis, p. 28.
The Design of IF Amplifiers For Color Television Receivers, Jack Avins, IRE Trans on Broadcast and TV Receivers, pp. 14-25, vol. 1952-1955, No. PGBTR-7, Jul. 1954.

*Primary Examiner*—Benedict V. Safourek
*Assistant Examiner*—Michael Allen Masinick
*Attorney, Agent, or Firm*—E. M. Whitacre; W. H. Meagher; W. B. Yorks, Jr.

[57] ABSTRACT

A network is provided for attenuating the adjacent channel sound carrier signal in a television receiver. First and second trap circuits are serially coupled intermediate the R.F. mixer and the first I.F. amplifier. One of the trap circuits is tuned to a frequency in the vicinity of and above the nominal frequency of the adjacent channel sound carrier, and the other is tuned to a frequency in the vicinity of and below that of the adjacent channel sound carrier. The two trap circuits are mutually coupled to a degree necessary to produce a composite response curve exhibiting a substantially constant level of maximum attenuation in the vicinity of the nominal frequency location of the adjacent channel sound carrier. The trap circuits provide attenuation in excess of that required to eliminate adjacent channel sound carrier interference over a bandwidth sufficient to encompass expected carrier deviation due to frequency modulation, carrier mislocation, and trap mistuning.

10 Claims, 5 Drawing Figures

DOUBLE TRAPPING OF ADJACENT CHANNEL SOUND

This invention relates to television intermediate frequency (I.F.) selectivity networks, and more particularly, to a network which attenuates the sound carrier signal of the channel adjacent to the desired television channel.

In a television receiver, signals at radio frequencies (R.F.) are received, amplified, and converted to intermediate frequencies by heterodyning with the output of an oscillator in a mixer. The frequency of the oscillator signal is controlled by the television channel selector so that the mixer will convert the R.F. signals of a selected television channel to specific I.F. frequencies. In the typical NTSC system, the sound carrier of the selected channel is converted to 41.25 MHz, the color carrier is converted to 42.17 MHz and the picture carrier is converted to 45.75 MHz. However, the mixer will indiscriminately convert all of the received R.F. signals to differing intermediate frequencies, including those of channels above and below the selected channel. The picture carrier of the upper adjacent channel is converted to 39.75 MHz, and the sound carrier of the lower adjacent channel is converted to 47.25 MHz. If the upper and lower adjacent channel signals have an appreciable amplitude with respect to the signals of the selected channel, (e.g., within 30 db), they can interact with the signals of the selected channel to produce distortions within the band of frequencies of the selected channel signals. For instance, the 47.25 MHz adjacent channel sound carrier is only 1.5 MHz away in frequency from the 45.75 MHz picture carrier of the selected channel. The 47.25 MHz sound carrier can intermodulate with the 45.75 MHz picture carrier as a result of nonlinear operation of the I.F. amplifier, to produce an undesired signal 1.5 MHz lower than the picture carrier, at 44.25 MHz. This undesired signal would be detected as a video information signal by the video detector in the television receiver, thereby creating an interfering pattern in the television image on the kinescope.

Even if the I.F. amplifier is operating linearly so as to prevent intermodulation distortion, the presence of the adjacent channel sound carrier can still cause problems in the video detector. If the adjacent channel sound carrier has an appreciable amplitude after I.F. amplification, it can be detected as a video information signal by the video detector and will appear at 1.5 MHz in the detected baseband signal. The adjacent channel sound carrier will thus appear as visible interference in the television picture. This interference will be visible even when the sound carrier is as much as 30 db lower in amplitude than the selected channel picture carrier.

To prevent the above-described distortion and interference, television receivers customarily employ circuits which remove, or trap out, the lower adjacent channel sound carrier, as well as the upper adjacent channel picture carrier, prior to I.F. signal processing. The above problems, which involve the adjacent channel sound carrier, are prevented by maintaining at least a 40 to 45 db differential between the adjacent channel sound and selected channel picture carriers in the television receiver. Although the sound carrier is normally broadcast at an amplitude which is 3 to 6 db lower than that of the picture carrier of the same channel, the adjacent channel sound carrier can have a larger amplitude than that of the selected channel picture carrier when the received selected channel signal is weaker (i.e., from a more distant station) than that of the lower adjacent channel. It is therefore often necessary to attenuate the adjacent channel sound carrier by more than 40–45 db in order to ensure the required amplitude differential between these two carriers.

Trap circuits for attenuating the adjacent channel sound and picture carriers are normally coupled between the mixer stage and the first I.F. amplifier of the television receiver. A typical arrangement is illustrated in RCA Television Service Data File 1978, C-2, for the CTC-87 Series Chassis. The I.F. signals from the turner and mixer are first applied to a bridged-T trap, comprising the parallel combination of a capacitor and an inductor. An intermediate tap on the inductor is coupled to an I.F. signal grounding point by a resistor. The trap is adjusted by moving two cores in the inductor, one of which adjusts the inductance of the trap, and a second which adjusts the Q and hence the bandwidth and depth of attenuation of the trap. Signals at the lower adjacent channel sound frequency are sharply attenuated by this bridged-T trap. The I.F. signals are then applied to a parallel L-C trap circuit, including an adjustable inductor having a single core for turning the circuit to attenuate the upper adjacent channel picture carrier at 40 MHz. The I.F. signals are then applied to the first I.F. amplifier.

A bridged-T trap such as that used in the CTC-87 chassis is capable of attenuating signals by as much as 70 db at its center tuned frequency. However, the response characteristic of the trap has sharp "skirts" which define the bandwidth of the trap at varying levels of attenuation. At a 45 db level of attenuation, for instance, the bandwidth of the trap is approximately 32 KHz, which means that signals at frequencies within 16 KHz of the center tuned frequency will be attenuated by 45 db or more; frequencies further away from the center frequency will be attenuated by less than 45 db.

The 32 KHz bandwidth can, under certain conditions, result in insufficient trapping of the adjacent channel sound carrier due to frequency shifts of the carrier. Frequency modulation of the sound carrier causes frequency deviations of the carrier over a 50 KHz range centered around its nominal center frequency. The frequency locations of the I.F. carriers may be in error by as much as 50 KHz, even with television receivers which employ automatic fine tuning circuits. And the center tuned frequency of the adjacent channel sound trap is generally adjusted to a tolerance of 20 KHz of its desired center frequency. When these tolerances combine, it is seen that the adjacent channel sound carrier can be anywhere within 95 KHz of the frequency location of the adjacent channel sound carrier trap. When the center frequency differs from the center tuned frequency of the CTC-87 trap by 70 KHz, it will be only 29 db lower than the level of the selected channel picture carrier, thereby causing video detection of the adjacent channel sound carrier and possible intermodulation distortion in the television receiver. The 29 db difference will be even less if the adjacent channel sound carrier is received from a stronger broadcast signal than that of the selected channel.

This problem is exacerbated when the television receiver is receiving signals from a CATV system. First, the sound and picture carriers are generally transmitted at equal amplitudes by the CATV broadcast equipment, which eliminates the usual 3-6 db signal differential which is characteristic of freely radiated broadcast signals. Second, the CATV broadcast equipment locates all of the carriers in the frequency spectrum of the CATV system. It is possible that the CATV equipment may not always maintain the nominal 1.5 MHz spacing between channels. Thus it is to be expected that the adjacent channel sound carrier may not be located at 47.25 MHz in the television receiver, but may deviate above and below this frequency depending on the performance of the particular CATV system.

Finally, automated tuning and alignment equipment is increasingly used in the manufacture and assembly of television receivers. Such automated equipment is capable of tuning trap inductors to their desired values, such as the single coil inductor in the 40 MHz trap in the CTC-87 chassis. However, the inductor of the bridged-T trap in the CTC-87 chassis employs two coaxially aligned cores for adjusting the inductance and the Q of the inductor. This inductor is adjusted by first adjusting the inductance core, then adjusting the Q core, then readjusting the inductance core to account for variations caused by the Q adjustment. Such a procedure is undesirable in an automated tuning and alignment system due to its complexity. It is much more desirable to use single core inductors in an automated tuning and alignment system, in which only a single adjustment is requied for each inductor.

In accordance with the principles of the present invention, a network is provided for attenuating the adjacent channel sound carrier signal in a television receiver. First and second trap circuits are serially coupled intermediate the R.F. mixer and the first I.F. amplifier. One of the trap circuits is tuned to a frequency in the vicinity of and above the nominal frequency of the adjacent channel sound carrier, and the other is tuned to a frequency in the vicinity of and below that of the adjacent channel sound carrier. The two trap circuits are mutually coupled to a degree necessary to produce a composite response curve exhibiting a substantially constant level of maximum attenuation in the vicinity of the nominal frequency location of the adjacent channel sound carrier. The trap circuits provide attenuation in excess of that required to eliminate adjacent channel sound carrier interference over a bandwidth sufficient to encompass expected carrier deviation due to frequency modulation, carrier mislocation, and trap mistuning. In an illustrative embodiment of the present invention, the trap circuits comprise bridged-T trap circuits, which utilize only single core inductors, thereby simplifying the automated tuning and alignment of the television receiver.

Figure 1:
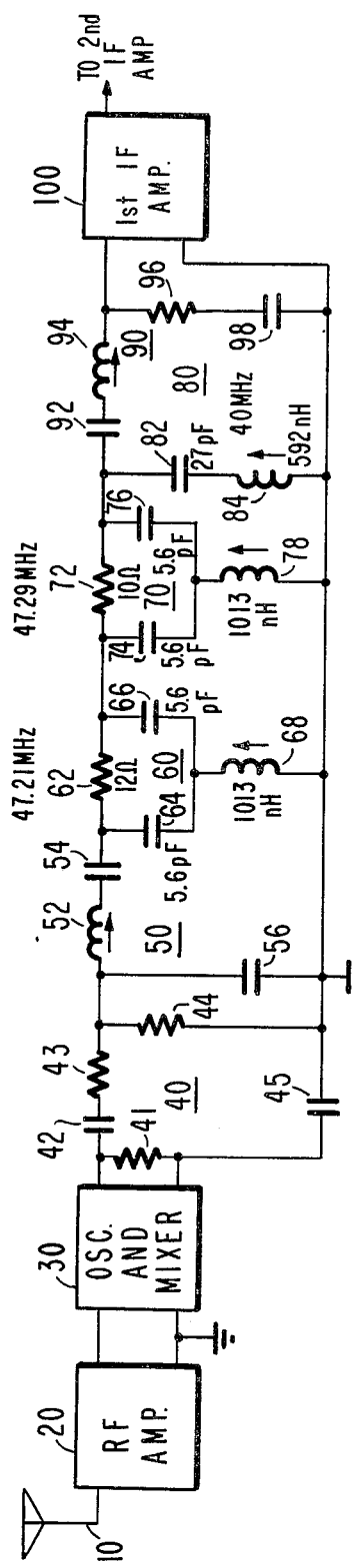
FIG. 1 illustrates, partially in block diagram form and partially in schematic diagram form, a low impedance network constructed in accordance with the principles of the present invention.

Referring to FIG. 1, a network constructed in accordance with the principles of the present invention is shown as a part of the input circuitry of a television receiver. R.F. television signals are received by an antenna 10 and coupled to an R.F. amplifier 20. The amplifier signals are then applied to an oscillator and mixer 30, where the signals are converted to I.F. frequencies. In the typical NTSC system and in this example, the selected television channel is converted to frequencies centered around 44 MHz. The upper adjacent channel picture carrier will then be located at approximately 39.75 MHz, and the lower adjacent channel sound carrier will be located at approximately 47.25 MHz.

The oscillator and mixer 30 is coupled to an input attenuator 40. The input attenuator 40 isolates the oscillator and mixer 30 from subsequent reactive circuit elements, and provides a proper terminating impedance for the oscillator and mixer 30. Typically, the I.F. signals are coupled to the attenuator 40 by a 50 ohm coaxial cable, which must be terminated by a 50 ohm load to prevent signal reflections. The input attenuator also performs an impedance transformation to match the coaxial cable to the input impedance of the next stage of reactive elements. In the present example, the input attenuator 40 provides the necessary impedance transformation to match a 50 ohm cable from the oscillator and mixer to a selectivity network having an impedance of approximately 40 ohms. The input attenuator 40 consists of a shunt resistor 41, the parallel combination of a capacitor 45 and the serial combination of a capacitor 42 and a resistor 43, and a second shunt resistor 44.

The input attenuator 40 is coupled to a first selectivity network 50, consisting of a capacitor 56 shunted to ground, and the serial combination of an adjustable inductor 52 and a capacitor 54. The first selectivity network 50 is coupled by two adjacent channel sound traps 60 and 70 to a second selectivity network 90. The second selectivity network 90 consists of the series connection of a capacitor 92 and an adjustable inductor 94, and the series combination of a resistor 96 and a capacitor 98 shunted to ground. The two selectivity networks cooperate to shape the I.F. passband of the selected television channel. The picture and color carriers are normally located on the upper and lower slopes of the passband response curve and are attenuated by 3 db relative to the center band gain. The sound carrier is usually located 20 db down on the lower slope of the response curve. Adjustable inductors 52 and 94 are adjusted to shape the passband.

The second selectivity network 90 is coupled to a first I.F. amplifier 100. In addition to band shaping, the second selectivity network 90 also provides an impedance transformation of the I.F. signals from a low impedance to a high impedance which better matches the high input impedance of the first I.F. amplifier. The I.F. signals are amplified by the first I.F. amplifier 100 and then applied to a second I.F. amplifier (not shown) for further amplification and signal processing.

Coupled between the first and second selectivity networks 50 and 90 are first and second adjacent channel sound traps 60 and 70. These two traps are each arranged in a bridged-T configuration. The first adjacent channel sound trap 60 is comprised of a resistor 62 coupled in parallel with two serially connected capacitors 64 and 66. An adjustable inductor 68 is coupled from the junction of the two capacitors 64 and 66 to ground. The second adjacent channel sound trap 70 is similarly arranged and includes the parallel combination of a resistor 72 and serially connected capacitors 74 and 76. An inductor 78 is coupled from the junction of the capacitors 74 and 76 to ground.

An upper adjacent channel picture trap 80 is coupled to ground from the junction of the second adjacent channel sound trap 70 and the second selectivity network 90. The adjacent channel picture trap 80 includes the series combination of a capacitor 82 and an inductor 84 coupled to ground. The trap 80 is a high Q trap which is tuned to approximately 40 MHz. Frequencies in the vicinity of this frequency, including the upper adjacent channel picture carrier and many of its sidebands, are severely attenuated by this trap.

Figure 2:
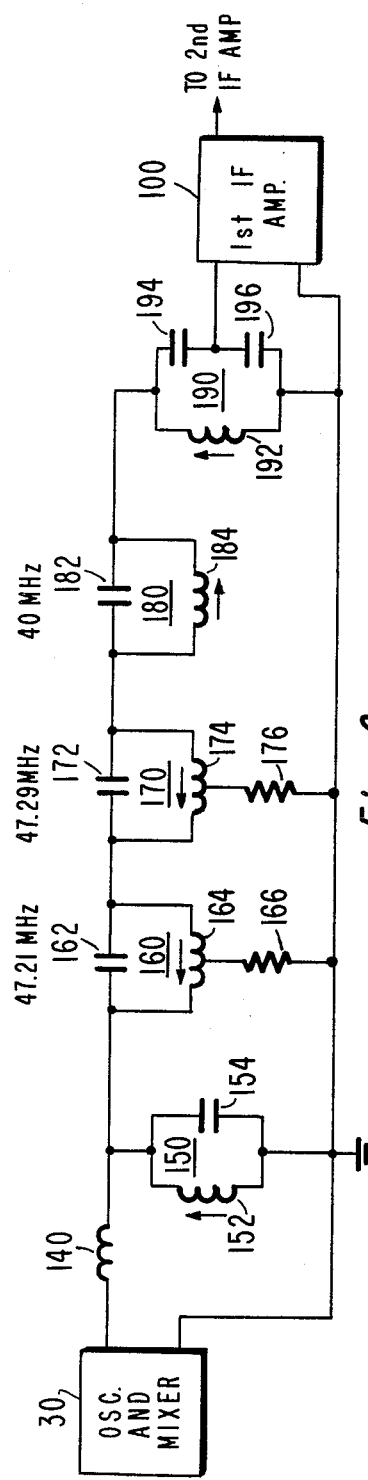
FIG. 2 illustrates, partially in block diagram form and partially in schematic diagram form, a high impedance network constructed in accordance with the principles of the present invention.

The network of FIG. 1 is a low impedance filter network, with the traps having an impedance of approximately 10 to 15 ohms. A high impedance equivalent of the network of FIG. 1 is illustrated in FIG. 2, comprising a network having an impedance in the range of 200 to 700 ohms, depending upon component values. The performance of the two networks is substantially the same, but the low impedance circuit is advantageous in that it uses no tapped inductors and has capacity values with high Q.

Referring to FIG. 2, the I.F. signals produced by the oscillator and mixer 30 are applied to a first selectivity network 150 by an inductor 140. The first selectivity network is comprised of the parallel combination of an adjustable inductor 152 and a capacitor 154 coupled between the I.F. signal path and ground. As in FIG. 1, the first selectivity network 150 cooperates with a second selectivity network 190 to provide shaping of the I.F. passband. The second selectivity network 190 is comprised of the parallel combination of an adjustable inductor 192 and two serially coupled capacitors 194 and 196. The second selectivity network is coupled between the I.F. signal path and ground. I.F. signals are taken from the junction of the capacitors 194 and 196 and applied to the first I.F. amplifier 100.

The first selectivity network 150 is coupled to the second by way of two adjacent channel sound carrier traps 160 and 170 and an adjacent channel picture carrier trap 180. The first adjacent channel sound trap 160 consists of the parallel combination of a capacitor 162 and an adjustable inductor 164 coupled in series with the I.F. signal path. A resistor 166 is coupled from a tap on the inductor 164 to ground. The second adjacent channel sound trap 170 is similarly comprised of the parallel combination of a capacitor 172 and an adjustable inductor 174 disposed in series with the I.F. signal path, and a resistor 176 coupled from a tap of the inductor 174 to ground. The adjacent channel picture trap 180 is coupled in series between the second adjacent channel sound trap 170 and the second selectivity network 190, and consists of the parallel combination of a capacitor 182 and an adjustable inductor 184. The adjacent channel picture trap 180 is a high Q trap, tuned to approximately 40 MHz.

Figure 3:
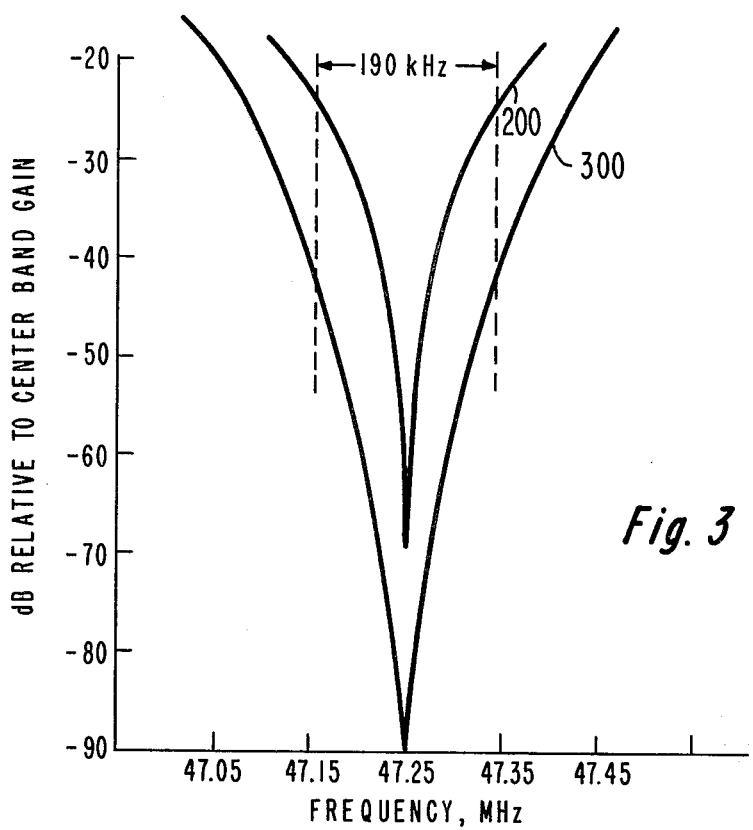
FIG. 3 illustrates response curves of a single adjacent channel sound trap and a double adjacent channel sound trap.

For reasons explained previously, it is desirable for the adjacent channel sound trap to attenuate the adjacent channel sound carrier by at least 40 to 45 db over a 190 kc bandwidth centered on the nominal 47.25 MHz frequency location of the sound carrier. Waveform 200 in FIG. 3 illustrates a typical response curve for a single bridged-T sound trap, such as that used in the RCA CTC-87 chassis. While the trap has a depth of approximately −70 db at center frequency, it is seen to have a 190 kc bandwidth at an attenuation level of only −24 db. Thus, intermodulation distortion and sound carrier detection interference can occur in this system when the adjacent channel sound carrier varies over the expected range of 190 kc around the nominal adjacent channel sound carrier frequency location.

Ideally, it would be desirable to attenuate the adjacent channel sound carrier through the use of two consecutively coupled traps, each tuned to a center frequency of 47.25 MHz. Such traps would produce the response curve 300 shown in FIG. 3. Response curve 300 is seen to have a maximum depth of approximately −90 db at center frequency, and has a 190 kc bandwidth at the −43 db level. This arrangement would adequately prevent the intermodulation distortion and sound carrier detection interference referred to previously.

However, in order to produce the response illustrated by waveform 300, it is necessary that both traps be independently tuned to the center frequency of 47.25 MHz, with no mutual coupling between the two traps. If construction of the trap circuits results in a small degree of mutual coupling between the traps, they will no longer exhibit the response shown by waveform 300, but will begin to exhibit characteristics of a double-tuned circuit.

Depending upon the degree of mutual coupling, the attenuation at center frequency will decrease considerably, thereby producing a double-humped response curve with frequencies of maximum attenuation above and below the center frequency. The mutual coupling can also cause the center frequency of the response curve to shift to a lower frequency, thereby displacing the entire response curve to a lower frequency.

The two traps are desirably located between the oscillator and mixer circuit and the first I.F. amplifier, to attenuate the adjacent channel sound carrier prior to the I.F. amplifiers, where intermodulation distortion can occur. The two traps must thus be in close physical proximity to each other. This will cause some degree of mutual inductive coupling, either due to the close physical proximity of the inductor coils, or through the ground plane connecting the two traps. While it may be possible to construct a specific circuit with virtually no mutual coupling between the two traps, such a possibility must be discounted when the trap circuits are manufactured in quantity, such as occurs in the mass production of a television receiver. It is therefore necessary to allow for variations in mutual inductive coupling in the design of a network which includes two adjacent channel sound traps.

In accordance with the principles of the present invention, the two adjacent channel sound traps of FIGS. 1 and 2 are not tuned to the nominal 47.25 MHz frequency of the adjacent channel sound carrier, but are tuned to frequencies above and below this frequency, respectively. Advantage is taken of the small amount of mutual inductive coupling between the two traps to produce a characteristic response curve with a substantially flat bottom, centered at the nominal frequency location of the adjacent channel sound carrier. Such a response curve is illustrated as waveform 400 in FIG. 4. The response curve 400 has a 190 kc bandwidth at an attenuation level of approximately −43 db, which is sufficient to prevent intermodulation distortion and sound carrier detection interference in the following I.F. amplifying stages and video detector.

Figure 4:
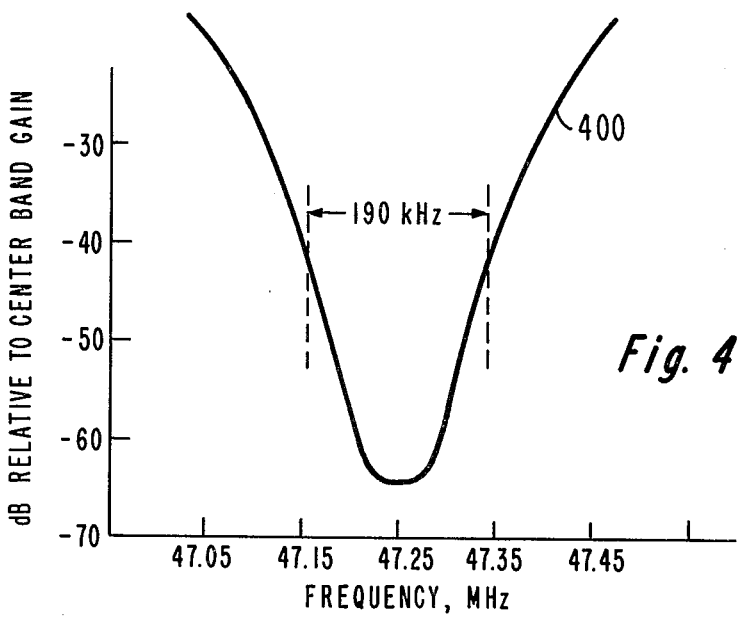
FIG. 4 illustrates a typical response curve for the networks of FIGS. 1 and 2.

The double traps of FIGS. 1 and 2 are easily aligned during adjustment of the television receiver to achieve the characteristic response shown in FIG. 4. Initially, the two traps are randomly tuned in the range of 40 to 50 MHz. At first, both traps are tuned to 47.25 MHz. One trap is then tuned to a significantly higher frequency above 47.29 MHz, and the other is precisely tuned to 47.21 MHz. At this time, the response curve of the two traps will not have a flat bottom, but will exhibit lesser attenuation at frequencies intermediate the two trap settings, thereby presenting a double-humped appearance. The higher tuned trap is then slowly returned toward its final nominal setting of 47.29 MHz. As this tuning proceeds, the double-humped response is gradually changed to that of the flat-bottomed response curve 400. Finally, when the flat-bottomed response is attained as the higher frequency traps reaches the vicinity of 47.29 MHz, the tuning process is terminated. This entire process is more fully explained in U.S. Pat. application No. 032,026, by Robert M. Evans, entitled *"METHOD FOR TUNING A FILTER CIRCUIT"*, concurrently filed herewith.

The Q's of the traps of the present invention are determined primarily by the component values of the traps, and will vary slightly from one trap to the next depending upon component tolerances. These Q variations do not affect the performance of the circuit, since the traps nominally have a combined attenuation depth in excess of −60 db. Although Q variations may decrease this depth slightly, such changes will not cause the trap depth to rise to the critical level of −45 db when the two traps are tuned in the vicinity of 47.25 MHz. By contrast, tolerance variations in the CTC-87 trap circuit can cause Q changes which can decrease the trap depth to −35 db. These Q changes must therefore be compensated by carefully adjusting the Q adjustment core of the trap inductor.

Unlike the two-core inductor of the CTC-87 trap, the bridged-T traps of the present invention each require only a single core adjustment. Adjustment of the cores changes the tuning frequencies of the traps without any significant effect of their Q's. The two traps may be adjusted simultaneously, which facilitates automated adjustment of a television receiver using the traps.

Figure 5:
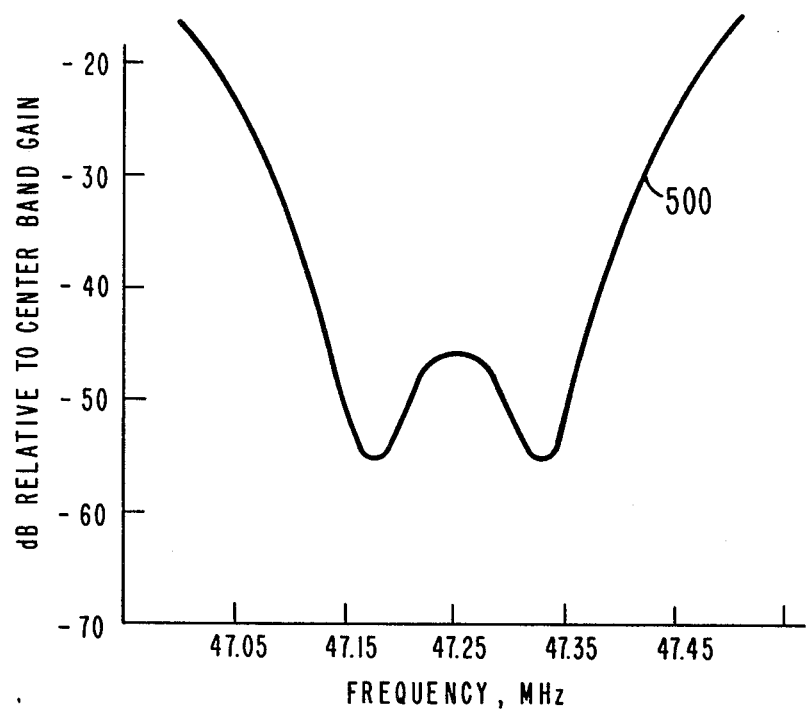
FIG. 5 illustrates a typical response curve for an overcoupled pair of adjacent channel sound traps.

Care must be taken during the initial layout and construction of the double-trap network of the present invention to ensure that the final assembly does not result in overcoupling of the two traps. Overcoupling will cause the two traps to exhibit the characteristic response shown by waveform 500 in FIG. 5. Waveform 500 is similar to the response of a typical double-tuned circuit as compared to that of waveform 400. More significantly, waveform 500 has a lesser attenuation level at the nominal frequency of the adjacent channel sound carrier than at frequencies above and below that frequency. However, the overcoupling problem is readily averted if careful attention is given to considerations such as inductor shielding and ground connections of the two traps.

What is claimed is:

1. In a television receiver including means for converting received radio frequency signals to intermediate frequency signals, the output of said converting means including a signal component of a selected television channel at a first intermediate frequency, and a signal component of an adjacent television channel at a second intermediate frequency subject to appearance within a given range of frequencies centered about a nominal frequency location; intermediate frequency signal processing apparatus comprising:
   means for amplifying said intermediate frequency signals; and
   a network coupled intermediate said converting means and said amplifying means, including, in cascade:
      a first trap circuit tuned to a frequency which is within said given range of frequencies and above said nominal frequency location; and
      a second trap circuit tuned to a frequency which is within said given range of frequencies and below said nominal frequency location,
   wherein mutual coupling between said first and second trap circuits is provided so as to establish an overall response characteristic for said network which exhibits a substantially flat bottom between the frequencies to which said trap circuits are tuned.

2. In a television receiver including means for converting received radio frequency signals to intermediate frequency signals, the output of said converting means including a signal component of a selected television channel at a first intermediate frequency, and a signal component of an adjacent television channel at a second intermediate frequency subject to appearance within a given range of frequencies centered about a nominal frequency location; intermediate frequency signal processing apparatus comprising:
   means for amplifying said intermediate frequency signals; and
   a network coupled intermediate said converting means and said amplifying means, including, in cascade:
      a first trap circuit tuned to a third frequency which is within said given range of frequencies and above said nominal frequency location; and
      a second trap circuit tuned to a fourth frequency which is within said given range of frequencies and below said nominal frequency location;
   wherein mutual coupling of signals between said first and second trap circuits is provided to a degree establishing an overall response characteristic for said network which provides substantially the same attenuation for signals in the band of frequencies lying between said third and fourth frequencies, independent of the phase and amplitude of said mutually coupled signals.

3. In a television receiver including means for converting received radio frequency signals to intermediate frequency signals, the output of said converting means including a signal component of a selected television channel at a first intermediate frequency, and a signal component of an adjacent television channel at a second intermediate frequency subject to appearance within a given range of frequencies centered about a nominal frequency location; intermediate frequency signal processing apparatus comprising:
   means for amplifying said intermediate frequency signals; and
   a network coupled intermediate said converting means and said amplifying means, including, in cascade:
      a first trap circuit tuned to a third frequency which is within said given range of frequencies and above said nominal frequency location; and
      a second trap circuit tuned to a fourth frequency which is within said given range of frequencies and below said nominal frequency location;

wherein mutual coupling of signals between said first and second trap circuits is provided to a degree establishing an overall response characteristic for said network which provides substantially the same attenuation for signals in the band of frequencies lying between said third and fourth frequencies, independent of the phase and amplitude of said mutually coupled signals, and wherein the level of attenuation provided in said band of frequencies is of such magnitude that the response of said network over said range of frequencies is sufficiently low relative to the response of said network at said first frequency as to substantially preclude development in said amplifying means of intermodulation products of an interfering level from said adjacent channel signal component.

4. In a televison receiver including means for converting received radio frequency signals to intermediate frequency signals, the output of said converting means including the picture carrier of a selected television channel at a first intermediate frequency, and the sound carrier of an adjacent television channel at a second intermediate frequency subject to appearance within a given range of frequencies centered about a nominal frequency location; intermediate frequency signal processing apparatus comprising:
  means for amplifying said intermediate frequency signals; and
  a network coupled intermediate said converting means and said amplifying means, including, in cascade:
    a first trap circuit tuned to a third frequency which is within said given range of frequencies and above said nominal frequency location; and
    a second trap circuit tuned to a fourth frequency which is within said given range of frequencies and below said nominal frequency location;
  wherein mutual coupling of signals between said first and second trap circuits is provided to a degree establishing an overall response characteristic for said network which provides substantially the same attenuation for signals in the band of frequencies lying between said third and fourth frequencies, independent of the phase and amplitude of said mutually coupled signals.

5. In a television receiver including means for converting received radio frequency signals to intermediate frequency signals, the output of said converting means including the picture carrier of a selected television channel at a first intermediate frequency, and the sound carrier of an adjacent television channel at a second intermediate frequency subject to appearance within a given range of frequencies centered about a nominal frequency location; intermediate frequency signal processing apparatus comprising: means for amplifying said intermediate frequency signals; and
  a network coupled intermediate said converting means and said amplifying means, including, in cascade:
    a first trap circuit tuned to a third frequency which is within said given range of frequencies and above said nominal frequency location; and
    a second trap circuit tuned to a fourth frequency which is within said given range of frequencies and below said nominal frequency location;
  wherein mutual coupling of signals between said first and second trap circuits is provided to a degree establishing an overall response characteristic for said network which provides substantially the same attenuation for signals in the band of frequencies lying between said third and fourth frequencies, independent of the phase and amplituide of said mutually coupled signals, and
  wherein the level of attenuation provided in said band of frequencies is of such magnitude that the response of said network over said range of frequencies is sufficiently low relative to the response of said network at said first frequency as to substantially preclude development in said amplifying means of intermodulation products of an interfering level from said adjacent channel sound carrier.

6. The apparatus of claim 5, wherein said first and second trap circuits each include an adjustable inductor having a single tuning core for adjusting the inductance of said inductor.

7. In a television receiver including means for converting received radio frequency signals to intermediate frequency signals, the output of said converting means including the picture carrier of a selected television channel at a first intermediate frequency, and the sound carrier of an adjacent television channel at a second intermediate frequency subject to appearance within a given range of frequencies centered about a nominal frequency location; intermediate frequency signal processing apparatus comprising:
  means for amplifying said intermediate frequency signals; and
  a network coupled intermediate said converting means and said amplifying means, including, in cascade:
    a first bridged-T trap circuit, including an adjustable inductor having a single tuning core for adjusting the inductance of said inductor, tuned to a frequency which is within said given range of frequencies and above said nominal frequency location; and
    a second bridged-T trap circuit, including an adjustable inductor having a single tuning core for adjusting the inductance of said inductor, tuned to a frequency which is within said given range of frequencies and below said nominal frequency location.

8. In a television receiver including means for converting received radio frequency signals to intermediate frequency signals, the output of said converting means including the picture carrier of a selected television channel at a first intermediate frequency, and the sound carrier of an adjacent television channel at a second intermediate frequency subject to appearance within a given range of frequencies centered about a nominal frequency location; intermediate frequency signal processing apparatus comprising:
  means for amplifying said intermediate frequency signals; and
  a network coupled intermediate said converting means and said amplifying means, including, in cascade:
    a first trap circuit, tuned to a frequency which is within said given range of frequencies and above said nominal frequency location, comprising:
      a first resistor serially coupled in said signal path;
      first and second serially coupled capacitors coupled in parallel with said first resistor; and
      a first adjustable inductor, having a core for varying the inductance of said inductor, and coupled between the junction of said first and second capacitors and a point of reference potential; and a second trap circuit, tuned to a frequency which is within said given range of frequencies and below said nominal frequency location, comprising:
   a second resistor, serially coupled to said first resistor in said signal path;
   third and fourth serially coupled capacitors coupled in parallel with said second resistor; and
   a second adjustable inductor, having a core for varying the inductance of said inductor, coupled between the junction of said third and fourth capacitors and a point of reference potential.

9. In a television receiver including means for converting received radio frequency signals to intermediate frequency signals, the output of said converting means including the picture carrier of a selected television channel at a first intermediate frequency, and the second carrier of an adjacent television channel at a second intermediate frequency subject to appearance within a given range of frequencies centered about a nominal frequency location; intermediate frequency signal processing apparatus comprising:
   means for amplifying said intermediate frequency signals; and
   a network coupled intermediate said converting means and said amplifying means, including, in cascade:
      a first trap circuit, tuned to a frequency which is within said given range of frequencies and above said nominal frequency location, comprising:
         a first capacitor serially coupled in said signal path;
         a first adjustable inductor, having an intermediate tap and a core for varying the inductance of said inductor, and coupled in parallel with said first capacitor; and
         a first resistor, coupled between said intermediate tap of said first adjustable inductor and a point of reference potential; and
      a second trap circuit tuned to a frequency which is within said given range of frequencies and below said nominal frequency location, comprising:
         a second capacitor serially coupled to said first capacitor in said signal path;
         a second adjustable inductor, having an intermediate tap and a core for varying the inductance of said inductor, and coupled in parallel with said second capacitor; and
         a second resistor, coupled between said intermediate tap of said second adjustable inductor and a point of reference potential.

10. In a television receiver, apparatus located intermediate a tuner and an intermediate frequency amplifier for shaping the passband of a desired television channel and attenuating the sound and picture carrier signals of adjacent undesired television channels, said adjacent channel sound carrier being subject to appearance within a given band of frequencies centered about a nominal frequency location, comprising:
   a first selectivity network coupled to an output of said tuner;
   a second selectivity network coupled to an input of said intermediate frequency amplifier; and
   means for coupling said first selectivity network to said second selectivity network including:
      a first trap circuit, coupled to said first selectivity network, and tuned to a frequency within said given band for frequencies and below said nominal frequency location;
      a second trap circuit coupled to said first trap circuit and tuned to a frequency within said given band of frequencies and above said nominal frequency location; and
      a third circuit, coupled between said second trap circuit and said second selectivity network and tuned to the nominal frequency of said adjacent channel picture carrier,
   wherein said first and second selectivity networks are tuned to shape the passband of said desired television channel.

* * * * *